(12) United States Patent
Gibson

(10) Patent No.: US 10,790,307 B2
(45) Date of Patent: Sep. 29, 2020

(54) SWITCH BRANCH STRUCTURE

(71) Applicant: Qorvo US, Inc., Greensboro, NC (US)

(72) Inventor: Samuel Gibson, Malmesbury (GB)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 16/200,965

(22) Filed: Nov. 27, 2018

(65) Prior Publication Data

US 2020/0168631 A1    May 28, 2020

(51) Int. Cl.
| | | |
|---|---|---|
| H01L 27/12 | (2006.01) |
| H01L 21/84 | (2006.01) |
| H01L 27/02 | (2006.01) |
| H01L 23/528 | (2006.01) |

(52) U.S. Cl.
CPC .......... *H01L 27/1203* (2013.01); *H01L 21/84* (2013.01); *H01L 23/5283* (2013.01); *H01L 27/0207* (2013.01)

(58) Field of Classification Search
CPC ............. H01L 27/1203; H01L 27/0207; H01L 23/5283
See application file for complete search history.

(56) References Cited

U.S. PATENT DOCUMENTS

| | | | |
|---|---|---|---|
| 5,796,334 A | 8/1998 | Chen et al. | |
| 6,326,822 B1 | 12/2001 | Yoon | |
| 6,359,317 B1 * | 3/2002 | Carroll | H01L 21/8249 |
| | | | 257/370 |
| 6,804,502 B2 | 10/2004 | Burgener et al. | |
| 6,882,829 B2 | 4/2005 | Mostov et al. | |
| 7,071,799 B2 | 7/2006 | Behzad | |

(Continued)

FOREIGN PATENT DOCUMENTS

| | | |
|---|---|---|
| CN | 105742363 A | 7/2016 |
| CN | 108110004 A | 6/2018 |

(Continued)

OTHER PUBLICATIONS

Shifrin, M.B. et al, "Monolithic FET structures for high-power control component applications," IEEE Transactions on Microwave Theory and Techniques, Dec. 1989, pp. 2134-2141, vol. 37, No. 12, IEEE.

(Continued)

*Primary Examiner* — Nathan W Ha
(74) *Attorney, Agent, or Firm* — Withrow & Terranova, P.L.L.C.

(57) ABSTRACT

Disclosed is a switch branch structure having an input terminal, an output terminal, and a series stack of an N-number of transistors formed in an active device layer within a first plane, wherein a first one of the N-number of transistors is coupled to the input terminal, and an nth one of the N-number of transistors is coupled to the output terminal, where n is a positive integer greater than one. A metal layer element has a planar body with a proximal end that is electrically coupled to the input terminal and distal end that is electrically open, wherein the planar body is within a second plane spaced from and in parallel with the first plane such that the planar body capacitively couples a radio frequency signal at the input terminal to between 10% and 90% of the N-number of transistors when the switch branch structure is in an off-state.

10 Claims, 4 Drawing Sheets

(56) References Cited

U.S. PATENT DOCUMENTS

| | | | |
|---|---|---|---|
| 7,135,766 B1* | 11/2006 | Costa | H01L 23/3677 |
| | | | 257/700 |
| 7,518,458 B2 | 4/2009 | Nakamura et al. | |
| 7,633,095 B1* | 12/2009 | Kerr | H01L 29/1045 |
| | | | 257/133 |
| 7,772,648 B1 | 8/2010 | Ivanov et al. | |
| 7,936,187 B1* | 5/2011 | Wu | G11C 27/02 |
| | | | 327/91 |
| 8,131,225 B2 | 3/2012 | Botula et al. | |
| 8,432,016 B1* | 4/2013 | Kerr | H01L 27/1203 |
| | | | 257/206 |
| 8,536,636 B2 | 9/2013 | Englekirk | |
| 9,356,144 B1* | 5/2016 | Mason | H01L 27/0255 |
| 9,484,973 B1* | 11/2016 | Carroll | H04B 1/28 |
| 2001/0040479 A1 | 11/2001 | Zhang | |
| 2002/0102971 A1 | 8/2002 | Jayaraman | |
| 2003/0223261 A1 | 12/2003 | Kato et al. | |
| 2004/0077327 A1 | 4/2004 | Lim et al. | |
| 2004/0174730 A1 | 9/2004 | Takashima | |
| 2006/0208833 A1 | 9/2006 | Sung et al. | |
| 2007/0018247 A1 | 1/2007 | Brindle et al. | |
| 2007/0024272 A1 | 2/2007 | Zentai | |
| 2007/0254446 A1 | 11/2007 | Pellizzer et al. | |
| 2008/0117894 A1 | 5/2008 | McMorrow | |
| 2009/0097281 A1 | 4/2009 | Lin | |
| 2009/0172242 A1 | 7/2009 | Piasecki | |
| 2010/0125989 A1 | 5/2010 | Huang et al. | |
| 2010/0200898 A1 | 8/2010 | Lin et al. | |
| 2010/0244263 A1 | 9/2010 | Lin et al. | |
| 2011/0001543 A1 | 1/2011 | Kondo et al. | |
| 2011/0068414 A1 | 3/2011 | Anderson et al. | |
| 2011/0214910 A1 | 9/2011 | Eldridge et al. | |
| 2011/0227569 A1 | 9/2011 | Cai et al. | |
| 2012/0139363 A1 | 6/2012 | Kerr et al. | |
| 2012/0268205 A1 | 10/2012 | Presti | |
| 2014/0312965 A1* | 10/2014 | Pruvost | H03J 1/0008 |
| | | | 327/553 |
| 2014/0340181 A1* | 11/2014 | Bakalski | H03J 5/244 |
| | | | 334/55 |
| 2015/0371905 A1* | 12/2015 | Carroll | H01L 21/84 |
| | | | 257/351 |
| 2016/0365850 A1* | 12/2016 | Hurwitz | H01L 27/1203 |
| 2017/0230049 A1* | 8/2017 | Shapiro | H03K 17/62 |
| 2018/0068941 A1* | 3/2018 | Howard | H01L 23/53228 |
| 2018/0159475 A1* | 6/2018 | Willard | H03F 1/523 |
| 2018/0323186 A1* | 11/2018 | Moen | H01L 21/76229 |
| 2019/0157985 A1* | 5/2019 | Gotz | H02M 7/003 |
| 2020/0091294 A1* | 3/2020 | Goktepeli | H01L 21/743 |

FOREIGN PATENT DOCUMENTS

| | | |
|---|---|---|
| EP | 2874315 B1 | 10/2017 |
| EP | 3565118 A1 | 11/2019 |
| WO | 2018121790 A1 | 7/2018 |

OTHER PUBLICATIONS

Non-Final Office Action for U.S. Appl. No. 12/944,212, dated Apr. 24, 2014, 17 pages.
Final Office Action for U.S. Appl. No. 12/944,212, dated Sep. 17, 2014, 20 pages.
Advisory Action for U.S. Appl. No. 12/944,212, dated Dec. 4, 2014, 3 pages.
Non-Final Office Action for U.S. Appl. No. 12/944,212, dated Aug. 27, 2015, 10 pages.
Final Office Action for U.S. Appl. No. 12/944,212, dated Feb. 5, 2016, 12 pages.
Notice of Allowance for U.S. Appl. No. 12/944,212, dated Jul. 6, 2016, 9 pages.
International Search Report and Written Opinion for International Patent Application No. PCT/US2019/063392, dated Feb. 18, 2020, 14 pages.

* cited by examiner

US 10,790,307 B2

SWITCH BRANCH STRUCTURE

FIELD OF THE DISCLOSURE

The present disclosure relates to a radio frequency switch used for wireless communication and in particular to providing voltage equalization for a series stack of transistors making up a switch branch of the radio frequency switch.

BACKGROUND

High-power radio frequency (RF) switches typically include at least one switch branch made up of a series stack of transistors that distribute a relatively high RF voltage to prevent transistor breakdown within the series stack of transistors. However, parasitic capacitances from the series stack of transistors to ground, or to adjacent structures, or to a wafer substrate create non-uniformities in the voltage distribution while at least one switch branch is in an off mode and blocking an RF signal. As a result, more transistors must be included in the series stack of transistors in order to withstand the relatively high RF voltage. Adding more transistors to the series stack of transistors increases the area taken up by a die that includes the switch branch. Moreover, these additional transistors increase an insertion loss for at least one switch branch made up of the series stack of transistors. Thus, there is a need for a switch branch that more uniformly distributes a relatively high RF voltage across the series stack of transistors so that the number of transistors making up the series stack of transistors can be reduced without risking a transistor breakdown within the series stack of transistors while not requiring additional die area.

SUMMARY

Disclosed is a switch branch structure having an input terminal, an output terminal, and a series stack of an N-number of transistors formed in an active device layer within a first plane, wherein a first one of the N-number of transistors is coupled to the input terminal, and an nth one of the N-number of transistors is coupled to the output terminal, where n is a positive integer greater than one. A metal layer element has a planar body with a proximal end that is electrically coupled to the input terminal and a distal end that is electrically open, wherein the planar body is within a second plane spaced from and in parallel with the first plane such that the planar body capacitively couples a radio frequency signal at the input terminal to between 10% and 90% of the N-number of transistors when the switch branch structure is in an off-state that blocks passage of the radio frequency signal from the input terminal to the output terminal.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

DETAILED DESCRIPTION

Figure 1:
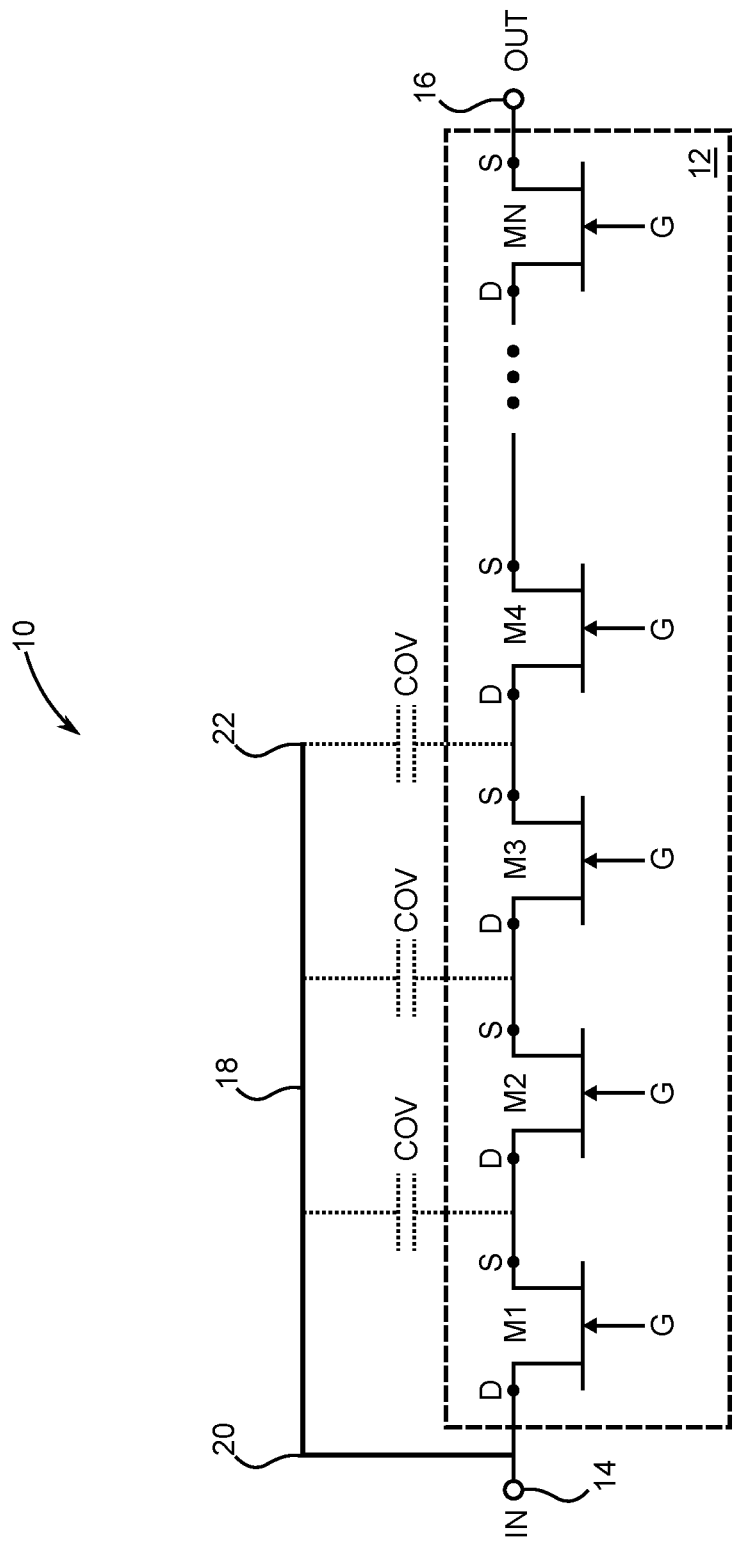
FIG. 1 is a schematic of an exemplary embodiment of a switch branch structure that is configured in accordance with the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

FIG. 1 is a schematic of an exemplary embodiment of a switch branch structure 10 that is configured in accordance with the present disclosure. As depicted in FIG. 1, the switch branch structure 10 includes a series stack of transistors 12 coupled between an input terminal 14 and an output terminal 16, wherein N is a positive number greater than one. In this exemplary embodiment, each of the N-number of transistors is a field-effect transistor having a drain D, a gate G, and a source S. In particular, a first transistor M1 of the series stack of transistors 12 has a drain D coupled to the input terminal 14, and an nth transistor MN of the n-number of transistors 12 has a source S coupled to the output terminal 16. A second transistor M2 has a drain D coupled to a source S of the first transistor M1. A third transistor M3 has a drain D coupled to a source S of the second transistor M2. A fourth transistor M4 has a drain D coupled to a source S of the third transistor M3. A metal layer element 18 has a proximal end 20 that is electrically coupled to the input terminal 14 and a distal end 22 that is electrically open. Overlap capacitance COV is formed between the metal layer element 18 and a percentage of the series stack of N-number of transistors 12. In the exemplary case depicted in FIG. 1, the overlap capacitance ends at the distal end 22 of the metal layer element 18. As a result of the overlap capacitance, a portion of a radio frequency signal applied to the input terminal 14 is fed forward to balance drain-to-source voltages across each transistor of the series stack of transistors 12 when the switch branch structure 10 is in an off-state that blocks passage of the radio frequency signal from the input terminal 14 to the output terminal 16. In the exemplary embodiment depicted in FIG. 1, the overlap capacitance is depicted schematically as capacitively coupling the input terminal 14 to drain/source nodes between the first, second, third, and fourth transistors M1, M2, M3, and M4, respectively. Capacitive coupling of the input terminal 14 to transistors past transistor M4 in this exemplary embodiment towards the nth transistor MN is negligible. Also, it is to be understood that extending the distal end of the metal layer element 18 to capacitively couple the nth transistor MN to the input terminal 14 is undesirable and may damage the nth transistor due to overvoltage. As such, there is a practical limit as to how far down the series stack of the N-number of transistors 12 that the metal layer element 18 can be extended.

Figure 2:
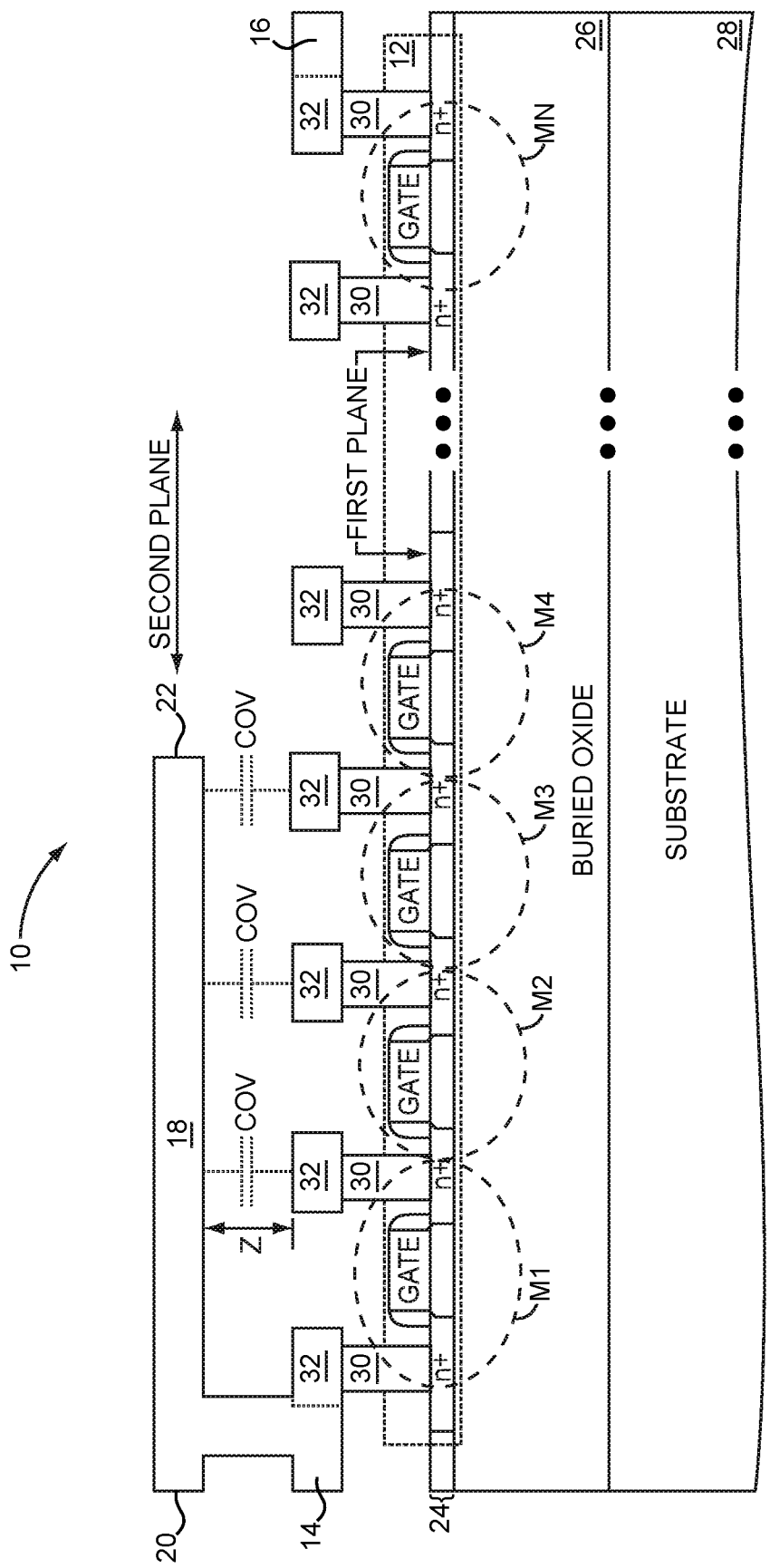
FIG. 2 depicts a cross-sectional view of the exemplary embodiment of the switch branch structure 10 of FIG. 1.

FIG. 2 depicts a cross-sectional view of the exemplary embodiment of the switch branch structure 10 of FIG. 1. As shown in this cross-sectional view, the series stack of transistors 12 is typically formed in an active device layer 24 by a process of wafer bonding followed by cleaving and polishing. The active device layer 24 lies within a first plane over a buried oxide layer 26 that insulates the active device layer 24 from a substrate 28. The substrate 28 may be of a silicon wafer type, and the transistors of the series stack transistors 12 may be silicon-on-insulator type field-effect transistors. Drain/source contacts 30 couple drain/diffusions to metal stripes 32 in a first metal layer. The metal layer element 18 is in a second metal layer within a second plane that is spaced from and in parallel with the first plane. The metal layer element 18 is spaced from the metal stripes 32 by a minimal distance Z. In at least some embodiments, the minimal distance Z ranges from 0.8 microns to 3 microns. In yet other embodiments, dielectric layers may be even thinner allowing for a minimal distance Z to extend down to 0.35 micron. The overlap capacitance COV represented by dotted line capacitor symbols is formed between the metal layer element 18 and predetermined ones of the metal stripes 32, which are selected to maximize equalization of drain-to-source voltages of the N-number of transistors making up the series stack of transistors 12.

Figure 3:
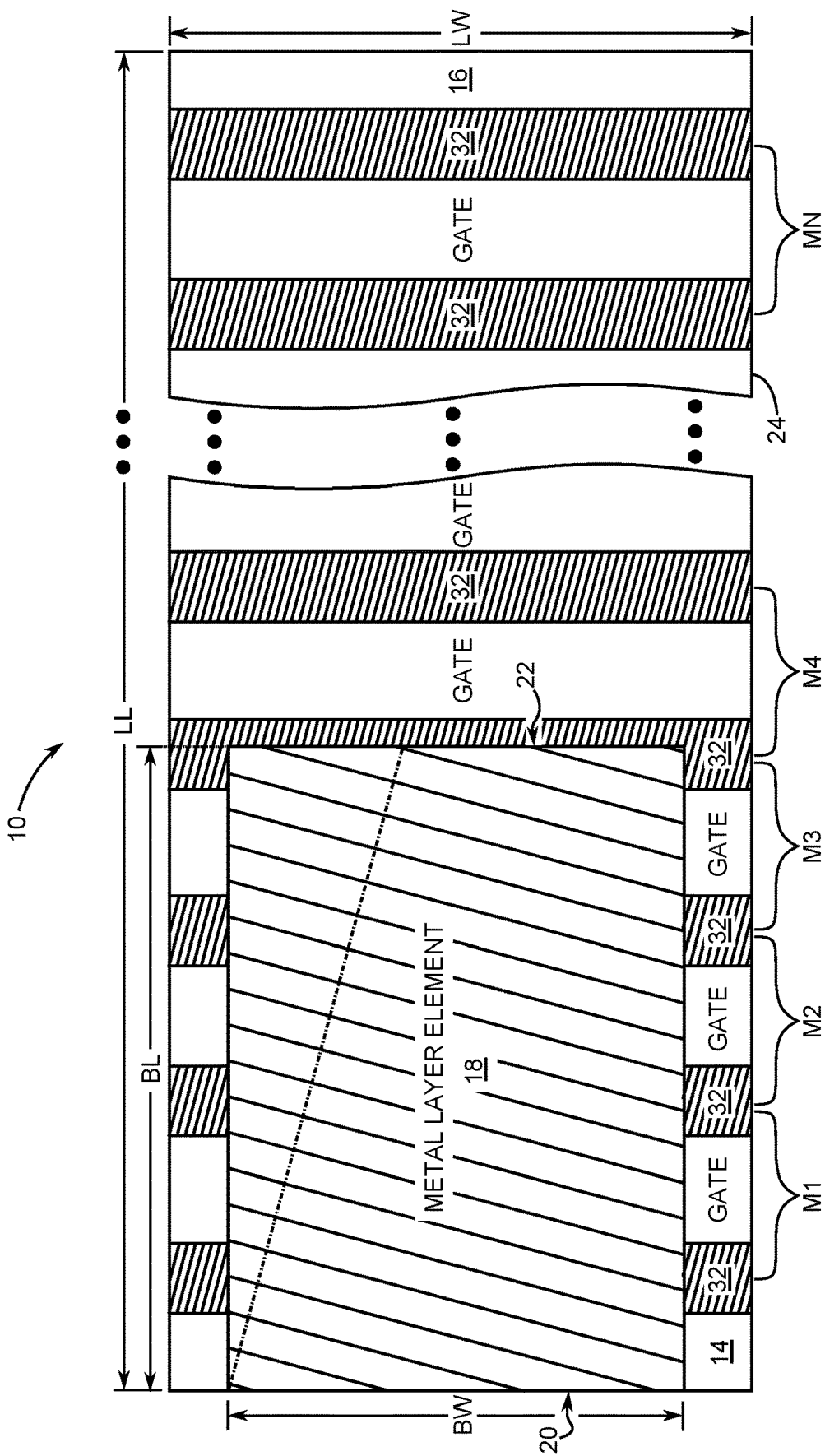
FIG. 3 depicts a top view of the exemplary embodiment of the switch branch structure of FIGS. 1 and 2.

FIG. 3 depicts a top view of the exemplary embodiment of the switch branch structure 10 of FIG. 1 and FIG. 2. As best depicted in FIG. 3, the active device layer 24 is rectangular with a layer length LL that extends between the input terminal 14 and the output terminal 16 and a layer width LW that is perpendicular to the layer length LL. In at least some embodiments, the metal layer element 18 has a planar body is substantially rectangular with a body length BL that is between 15% and 75% of the layer length LL and a body width BW that is between 50% and 100% of the layer width LW. In other embodiments, the metal layer element 18 has a planar body having other shapes. For example, the metal layer element 18 may have one or more tapered edges, such as depicted in dot-dash line extending diagonally across the illustration of the metal layer element 18 in FIG. 3.

In at least some embodiments, the planar body of the metal layer element 18 extends over between 66% and 75% of the N-number of transistors that are closest to the input terminal 14. Moreover, in at least some exemplary embodiments, the metal layer element 18 has a planar body that does not extend over between 25% and 50% of the N-number of transistors that are closest to the output terminal 16. In general, the planar body of the metal layer element 18 capacitively couples a radio frequency signal at the input terminal 14 to a predetermined percentage that is between 10% and 90% of the N-number of transistors making up the series stack of transistors 12 when the switch branch structure 10 is in an off-state that blocks passage of the radio frequency signal from the input terminal 14 to the output terminal 16.

In operation, the metal layer element 18 (FIGS. 1-3) capacitively couples a radio frequency signal at the input terminal 14 to a predetermined number of the N-number of transistors of the series stack of transistors 12 when the switch branch structure 10 is in an off-state that blocks passage of the radio frequency signal from the input terminal 14 to the output terminal 16. As a result of feed-forward coupling of the radio frequency signal to the predetermined number of N-number of transistors on the switch branch structure 10, drain-to-source voltages of each of the N-number of transistors range no more than 7% higher and 7% lower than exactly uniform drain-to-source voltages across each of the N-number of transistors when the radio frequency signal is applied at the input terminal 14 with the switch branch structure 10 in the off-state.

Figure 4:
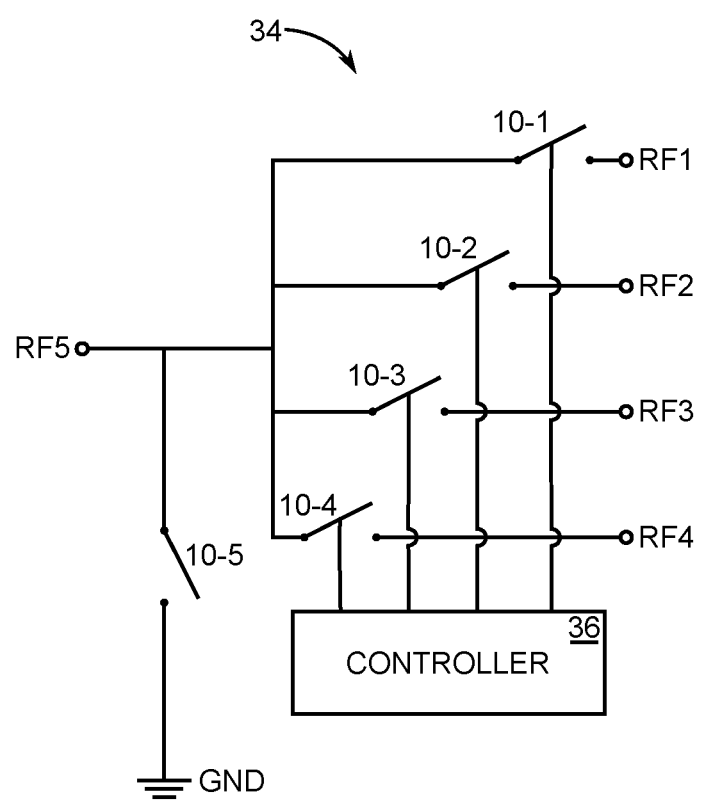
FIG. 4 is a schematic of a single-pole four-throw (SP4T) switch made up of a plurality of the exemplary switch branch structures depicted in FIGS. 1-3.

FIG. 4 is a schematic of a single-pole four-throw (SP4T) switch 34 made up of a plurality of the exemplary switch branch structures 10 depicted in FIGS. 1-3. Radio frequency signal ports RF1, RF2, RF3, and RF4 are selectively coupled to a common radio frequency signal port RF5 through switch branch structures 10-1, 10-2, 10-3, and 10-4. A controller 36 selectively opens and closes the switch branch structures 10-1, 10-2, 10-3, and 10-4 in response to a control program that may, for example, include instructions to close and open when a radio front-end of a wireless device (not shown) changes operation between frequency bands. A fifth switch branch structure 10-5 is depicted coupled between a radio frequency signal port RF5 and a fixed voltage node such as ground. In this exemplary embodiment, the fifth switch branch structure 10-5 is usable for electrostatic static discharge protection and automatically closes to shunt energy from an electrostatic static discharge event away from the radio frequency signal ports RF1, RF2, RF3, and RF4.

Table 1 compares breakdown voltage performance of the SP4T switch of FIG. 4 versus a comparable SP4T switch that does not employ the disclosed metal layer element that balances drain-to-source voltages. Notice from the table that without the advantage of voltage equalization provided by the metal layer element 18 (FIGS. 1-3), an average peak breakdown voltage for an identical series stack of transistors to the series stack of transistors 12 is about 75 volts peak ($V_{PK}$). In contrast, the series branch structure 10 that includes the metal layer element 18 provides a voltage equalization that yields an increased average peak breakdown voltage of nearly 84 $V_{PK}$.

TABLE 1

| PORT | OFF-STATE VOLTAGE WITHOUT METAL LAYER ELEMENT 18 | OFF-STATE VOLTAGE WITH METAL LAYER ELEMENT 18 |
|---|---|---|
| RF1 | 84.2 $V_{PK}$ | 86.2 $V_{PK}$ |
| RF2 | 76.0 $V_{PK}$ | 83.3 $V_{PK}$ |
| RF3 | 83.3 $V_{PK}$ | 86.2 $V_{PK}$ |
| RF4 | 75.1 $V_{PK}$ | 81.4 $V_{PK}$ |
| RF5 | 56.3 $V_{PK}$ | 82.3 $V_{PK}$ |

The switch branch structure 10 of FIGS. 1-3 and employed in FIG. 4 is constructed by first fabricating the series stack of transistors 12 in the active device layer 24 within a first plane, wherein a first one of the N-number of transistors of the series stack of transistors 12 is coupled to the input terminal 14, and an nth one of the N-number of transistors is coupled to the output terminal 16, where n is a positive integer greater than one. The series stack of transistors 12 is typically formed in the active device layer 24 by a process of wafer bonding followed by cleaving and polishing. Finishing steps include fabricating the metal layer element 18 having a planar body with the proximal end 20 that is electrically coupled to the input terminal 14 and the distal end 22 that is electrically open, wherein the planar body is within a second plane spaced from and in parallel with the first plane such that the planar body capacitively couples a radio frequency signal at the input terminal 14 between 10% and 90% of the N-number of transistors when the switch branch structure 10 in an off-state that blocks passage of the radio frequency signal from the input terminal 14 to the output terminal 16.

Those skilled in the art will recognize improvements and modifications to the preferred embodiments of the present disclosure. All such improvements and modifications are considered within the scope of the concepts disclosed herein and the claims that follow.

What is claimed is:

1. A switch branch structure comprising:
an input terminal, an output terminal, and a series stack of an N-number of transistors formed in an active device layer within a first plane, wherein a first one of the N-number of transistors is coupled to the input terminal, and an nth one of the N-number of transistors is coupled to the output terminal, where n is a positive integer greater than four; and
a metal layer element having a planar body with a proximal end that is electrically coupled to the input terminal and a distal end that is electrically open, wherein the planar body is within a second plane spaced from and in parallel with the first plane such that the planar body overlaps more than at least two of the N-number of transistors to capacitively couple a radio frequency signal at the input terminal to between 50% and 80% of the N-number of transistors when the switch branch structure is in an off-state that blocks passage of the radio frequency signal from the input terminal to the output terminal.

2. The switch branch structure of claim 1 wherein the planar body of the metal layer element does not extend over between 25% and 50% of the N-number of transistors that are closest to the output terminal.

3. The switch branch structure of claim 1 wherein the planar body of the metal layer element extends over between 50% and 75% of the N-number of transistors that are closest to the input terminal.

4. The switch branch structure of claim 1 wherein the active device layer is rectangular with a layer length that extends between the input terminal and the output terminal and a layer width that is perpendicular to the layer length.

5. The switch branch structure of claim 4 wherein the planar body of the metal layer element is substantially rectangular with a body length that is between 50% and 75% of the layer length.

6. The switch branch structure of claim 4 wherein the planar body of the metal layer element is substantially rectangular with a body width that is between 50% and 100% of the layer width.

7. The switch branch structure of claim 4 wherein the planar body of the metal layer element is substantially rectangular with a body width that is between 50% and 100% of the layer width and a body length that is between 50% and 75% of the layer length.

8. The switch branch structure of claim 1 wherein the N-number of transistors are field-effect transistors that each has a gate, a source, and a drain.

9. The switch branch structure of claim 8 wherein the N-number of transistors are silicon-on-insulator type field-effect transistors.

10. The switch branch structure of claim 8 wherein drain-to-source voltages of each of the N-number of transistors range no more than 7% higher and 7% lower than exactly uniform drain-to-source voltages across each of the N-number of transistors when the radio frequency signal is applied at the input terminal with the switch branch structure in an off-state that blocks passage of the radio frequency signal from the input terminal to the output terminal.

* * * * *